United States Patent
Yano et al.

(10) Patent No.: US 12,402,260 B2
(45) Date of Patent: Aug. 26, 2025

(54) VENTILATION COMPONENT

(71) Applicant: NITTO DENKO CORPORATION, Ibaraki (JP)

(72) Inventors: Youzou Yano, Osaka (JP); Tomoyuki Kasagi, Osaka (JP); Takumi Takahashi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 471 days.

(21) Appl. No.: 17/784,039

(22) PCT Filed: Dec. 9, 2020

(86) PCT No.: PCT/JP2020/045917
§ 371 (c)(1),
(2) Date: Jun. 9, 2022

(87) PCT Pub. No.: WO2021/117779
PCT Pub. Date: Jun. 17, 2021

(65) Prior Publication Data
US 2023/0034108 A1     Feb. 2, 2023

(30) Foreign Application Priority Data
Dec. 9, 2019   (JP) ................... 2019-222104

(51) Int. Cl.
*H05K 5/02*    (2006.01)
(52) U.S. Cl.
CPC .................. *H05K 5/0214* (2022.08)
(58) Field of Classification Search
CPC .. H05K 5/0213; H05K 5/0214; H05K 5/0216; F16B 33/004
See application file for complete search history.

(56) References Cited

U.S. PATENT DOCUMENTS

| | | | |
|---|---|---|---|
| 2008/0041624 A1* | 2/2008 | Sasaki | H05K 5/068 174/520 |
| 2013/0055898 A1 | 3/2013 | Yano | |

(Continued)

FOREIGN PATENT DOCUMENTS

| | | | | |
|---|---|---|---|---|
| DE | 19827896 A1 * | 12/1999 | ............ | F16B 33/004 |
| DE | 102005029730 A1 | 2/2007 | | |

(Continued)

OTHER PUBLICATIONS

International Search Report issued for International Patent Application No. PCT/JP2020/045917, Date of mailing: Feb. 16, 2021, 5 pages including English translation.

(Continued)

*Primary Examiner* — Edelmira Bosques
*Assistant Examiner* — Michael James Giordano
(74) *Attorney, Agent, or Firm* — HSML P.C.

(57) ABSTRACT

A ventilation component 1 includes a ventilation path 10 for allowing ventilation between an inner space 2u and an outer space 2s of a housing 2. The ventilation path 10 is a path for allowing ventilation between the internal space 2u and the outer space 2s when the ventilation component 1 is attached to an edge 2f. The ventilation component 1 includes a supporting portion 12, a gas-permeable membrane 11, a protruding portion 13, and a sealing member 14. The supporting portion 12 surrounds the ventilation path 10. The gas-permeable membrane 11 is bonded to the supporting portion 12 and closes the ventilation path 10 in a ventilatable manner. The protruding portion 13 is a part having a tubular shape, the part being arranged to protrude from the supporting portion 12 and surround one end of the ventilation path 10, the part being configured to be in contact with the edge 2f when the ventilation component 1 is attached to the edge (Continued)

2f. The ventilation component 1 satisfies a requirement $0.7 \leq D/W \leq 1.3$.

6 Claims, 6 Drawing Sheets

(56) References Cited

U.S. PATENT DOCUMENTS

| | | | |
|---|---|---|---|
| 2014/0047981 | A1 | 2/2014 | Uemura et al. |
| 2017/0187018 | A1 | 6/2017 | Pflueger et al. |
| 2020/0088440 | A1 | 3/2020 | Yano et al. |
| 2020/0325928 | A1* | 10/2020 | Treffert .................... F16F 1/18 |
| 2020/0340592 | A1 | 10/2020 | Nakayama et al. |

FOREIGN PATENT DOCUMENTS

| | | |
|---|---|---|
| DE | 102014210231 A1 | 12/2015 |
| DE | 102016224841 A1 | 6/2017 |
| EP | 1363069 B2 | 2/2019 |
| JP | S4733102 Y1 | 10/1972 |
| JP | 2005150376 A | 6/2005 |
| JP | 2006041304 A | 2/2006 |
| JP | 2007048585 | 2/2007 |
| JP | 2012231089 | 11/2012 |
| JP | 2012243536 | 12/2012 |
| JP | 2018182030 | 11/2018 |
| WO | 2018199192 A1 | 11/2018 |

OTHER PUBLICATIONS

Written Opinion issued for International Patent Application No. PCT/JP2020/045917, Date of mailing: Feb. 16, 2021, 6 pages including English translation.

Office Action issued for Indian Patent Application No. 202217038742, Date of Dispatch: Nov. 21, 2022, 5 pages.

Notice of Reasons for Refusal issued for Japanese Patent Application No. 2021-564008, Dispatch Date: Jun. 13, 2023, 7 pages including English machine translation.

Decision of Refusal issued for Japanese Patent Application No. 2021-564008, Dispatch Date: Nov. 14, 2023, 9 pages including English machine translation.

Request for the Submission of an Opinion issued for Korean Patent Application No. 10-2022-7020240, dated May 27, 2024, 10 pages including English machine translation.

Second Office Action issued for Chinese Patent Application No. 202080071964.9, dated Jun. 26, 2024, 9 pages including English machine translation.

Office Action issued for German Patent Application No. 11 2020 006 019.5, dated Jan. 27, 2025, 12 pages including English translation.

Notice of Final Rejection issued for Korean Patent Application No. 10-2022-7020240 , Dispatched date: Jan. 23, 2025, 8 pages including English machine translation.

* cited by examiner

VENTILATION COMPONENT

TECHNICAL FIELD

The present invention relates to a ventilation component.

BACKGROUND ART

Ventilation components configured to be attached to an edge of an opening of a housing have been known. Ventilation components can be used, for example, in devices such as vehicle lamps, inverters, converters, electronic control units (ECUs), battery packs, millimeter-wave radars, and vehicle-mounted cameras to eliminate a pressure difference occurring between the inside and the outside of the devices due to a temperature variation. These devices are sometimes required to prevent substances such as foreign matters, water, oil, and salt from entering the devices. In response to such a request, ventilation components are attached to housings of the devices.

For example, Patent Literature 1 describes a ventilation unit including: a ventilation member configured to be attached to an opening of a housing; a sealing member; and a washer. The sealing member seals a gap between the housing and the ventilation member. The washer is a ring-shaped member surrounding the sealing member. This configuration can prevent foreign matters from entering the housing from between the ventilation member and the housing even under a high external pressure environment created by, for example, jetting of high-pressure water toward automotive electrical components.

Patent Literature 2 describes a ventilation structure including a housing, a ventilation member, and a sealing member. The housing is provided with an opening. The ventilation member is attached to the opening of the housing. The sealing member is held by the ventilation member. The opening has a tapered surface. The ventilation member includes a support having a ventilation path, a waterproof gas-permeable membrane closing the ventilation path, and a cover covering the waterproof gas-permeable membrane. Around the ventilation path, the sealing member seals a gap between the housing and the support. The support has a pressing portion pressing the sealing member against the tapered surface. As the sealing member is placed in the opening, this configuration can prevent the sealing member from being directly exposed, due to, for example, jetting of high-pressure water toward automotive electrical components, to water coming from the outside.

Patent Literature 3 describes a ventilation structure including an opening portion of a housing, a ventilation member, and a shield. The ventilation member is fixed to the opening portion and includes a gas-permeable membrane. The shield is in the shape of a protrusion arranged on a surface of the housing. In the case where the ventilation structure described in Patent Literature 3 is applied to an ECU in an engine room of an automobile, the ventilation structure improves the resistance to a water stream applied in high-pressure washing of the engine room. The shield blocks part of the water stream, so that the water pressure applied to the ventilation member can be decreased.

CITATION LIST

Patent Literature

Patent Literature 1: JP 2012-231089 A
Patent Literature 2: JP 2012-243536 A
Patent Literature 3: JP 2007-048585 A

SUMMARY OF INVENTION

Technical Problem

The techniques described in Patent Literatures 1 to 3 require the washer, the opening having the tapered surface, and the shield, which impose restrictions upon design and manufacturing of ventilation structures.

Therefore, the present invention provides a ventilation component capable of reducing restrictions upon design and manufacture thereof and capable of preventing water from entering a housing upon exposure to a high-pressure water stream.

Solution to Problem

The present invention provides a ventilation component configured to be attached to an edge of an opening of a housing, the opening communicating with an inner space and an outer space of the housing, the ventilation component comprising:

a ventilation path for allowing ventilation between the inner space and the outer space when the ventilation component is attached to the edge;

a supporting portion surrounding the ventilation path;

a gas-permeable membrane bonded to the supporting portion and closing the ventilation path in a ventilatable manner;

a protruding portion having a tubular shape, the protruding portion being arranged to protrude from the supporting portion and surround one end of the ventilation path, the protruding portion being configured to be in contact with the edge when the ventilation component is attached to the edge; and a sealing member disposed around the protruding portion, the sealing member being configured to seal a gap between an outer surface of the housing and the ventilation component when the ventilation component is attached to the edge, wherein the ventilation component satisfies a requirement $0.7 \leq D/W \leq 1.3$, where D is a distance from an outer edge of an outer face of the supporting portion to a boundary between the protruding portion and the supporting portion, the outer face being in contact with the protruding portion, the outer edge being defined when the outer face is viewed in plan, and W is a cross-sectional diameter of the sealing member.

Advantageous Effects of Invention

The above ventilation component can reduce restrictions upon design and manufacturing of a ventilation structure. Moreover, the above ventilation component can prevent water from entering a housing upon exposure to a high-pressure water stream.

DESCRIPTION OF EMBODIMENTS

Hereinafter, embodiments of the present invention will be described with reference to the drawings. The following description describes examples of the present invention, and the present invention is not limited to the following embodiments.

Figure 1:
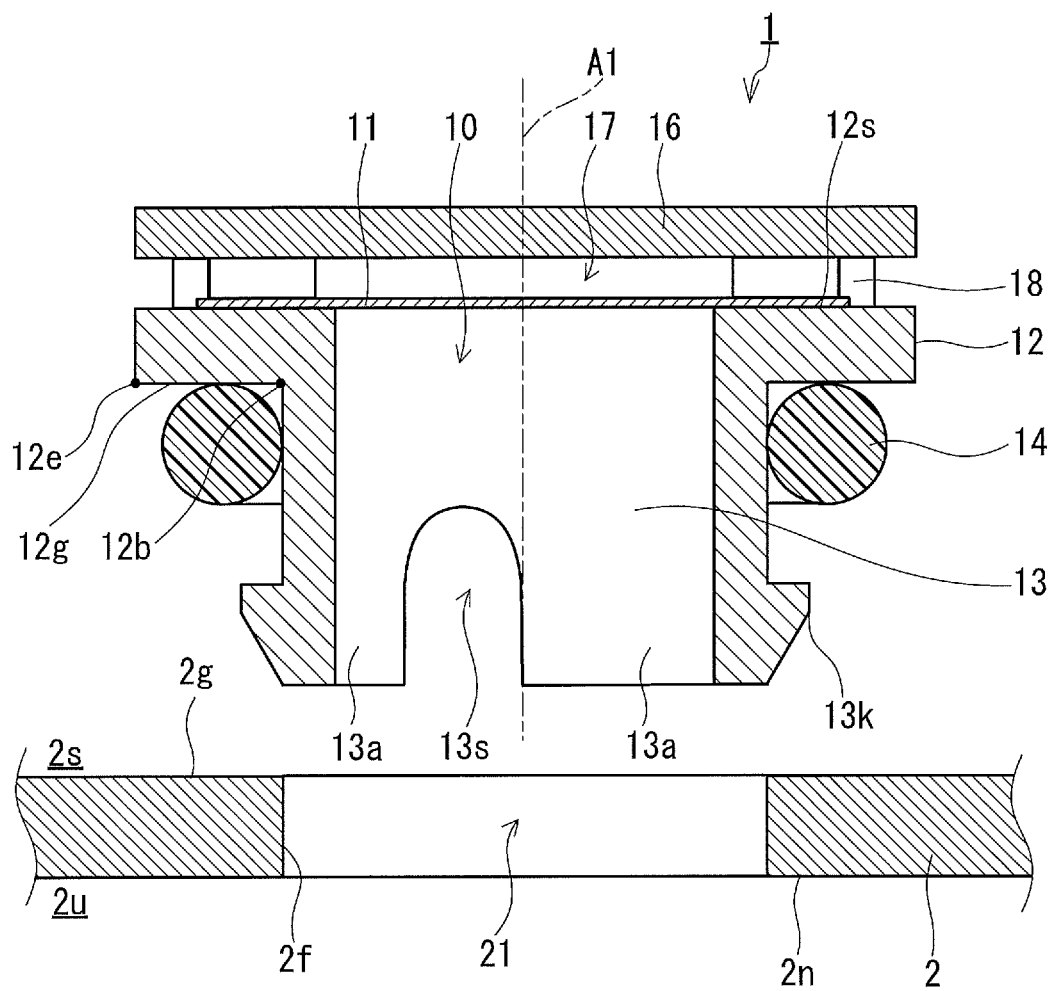
FIG. 1 is a cross-sectional view showing an example of a ventilation component according to the present invention.
Figure 2A:
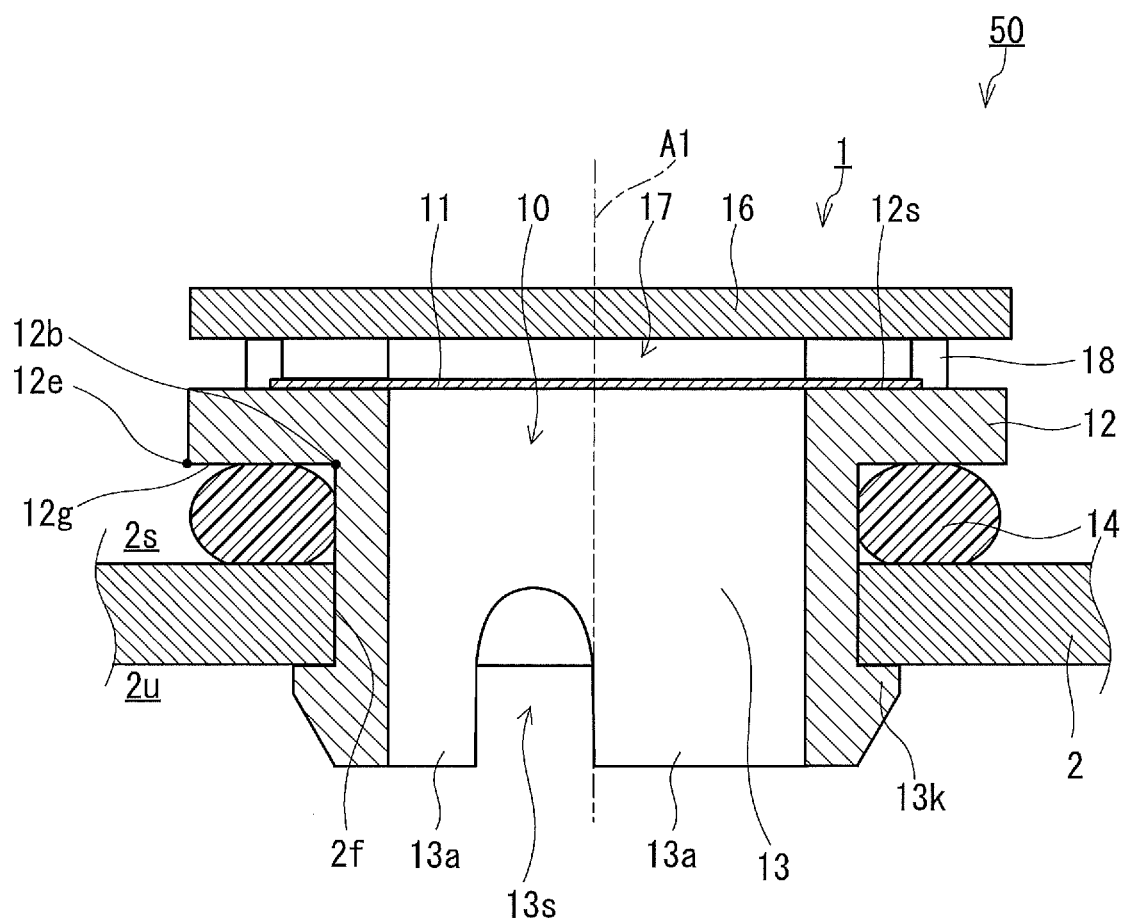
FIG. 2A is a cross-sectional view showing an example of a ventilation structure provided using the ventilation component shown in FIG. 1.
Figure 3:
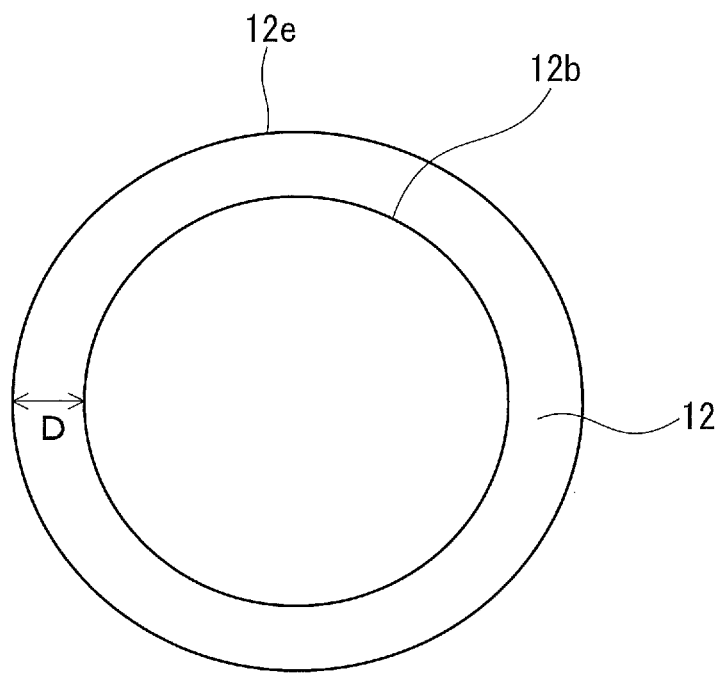
FIG. 3 is a plan view showing a specific part of the ventilation component shown in FIG. 1.
Figure 4:
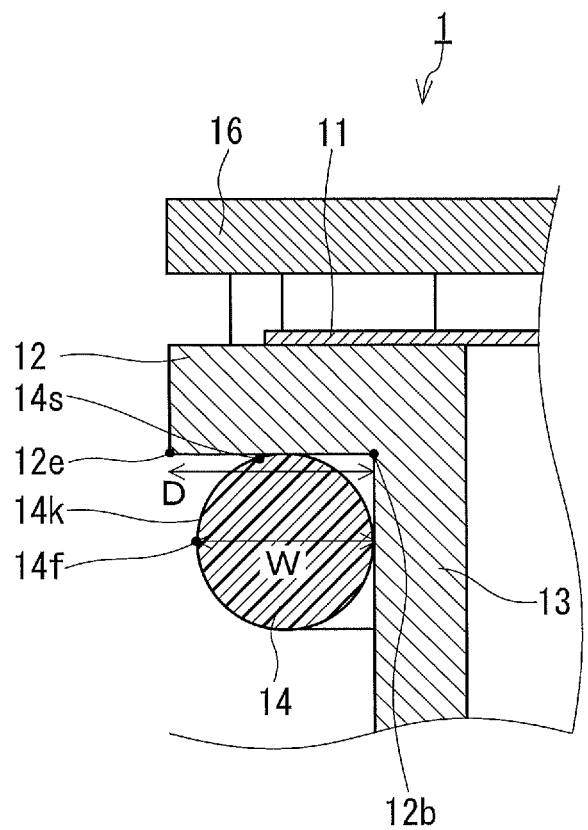
FIG. 4 is a cross-sectional view showing part of the ventilation component shown in FIG. 1.

As shown in FIGS. 1 and 2A, the ventilation component 1 is configured to be attached to an edge 2$f$ of an opening 21 of a housing 2, the opening 21 communicating with an internal space 2$u$ and an outer space 2$s$ of the housing 2. The ventilation component 1 includes a ventilation path 10. The ventilation path is a path for allowing ventilation between the internal space 2$u$ and the outer space 2$s$ when the ventilation component 1 is attached to the edge 2$f$. The ventilation component 1 includes a supporting portion 12, a gas-permeable membrane 11, a protruding portion 13, and a sealing member 14. The supporting portion 12 surrounds the ventilation path 10. The gas-permeable membrane 11 is bonded to the supporting portion 12 and closes the ventilation path 10 in a ventilatable manner. The protruding portion 13 is a part having a tubular shape, the part being arranged to protrude from the supporting portion 12 and surround one end of the ventilation path 10, the part being configured to be in contact with the edge 2$f$ when the ventilation component 1 is attached to the edge 2$f$. The sealing member 14 is disposed around the protruding portion 13, and seals a gap between an outer surface 2$g$ of the housing 2 and the ventilation component 1 when the ventilation component 1 is attached to the edge 2$f$. The ventilation component 1 satisfies a requirement $0.7 \leq D/W \leq 1.3$. FIG. 3 is a plan view of a part of the supporting portion 12 between an outer edge 12$e$ of an outer face 12$g$ of the supporting portion 12 and a boundary 12$b$ between the protruding portion 13 and the supporting portion 12, the outer face 12$g$ being in contact with the protruding portion 13, the outer edge 12$e$ being defined when the outer face 12$g$ is viewed in plan. As shown in FIG. 3, D represents a distance from the outer edge 12$e$ to the boundary 12$b$. As shown in FIG. 4, W represents a cross-sectional diameter of the sealing member 14.

Figure 2B:
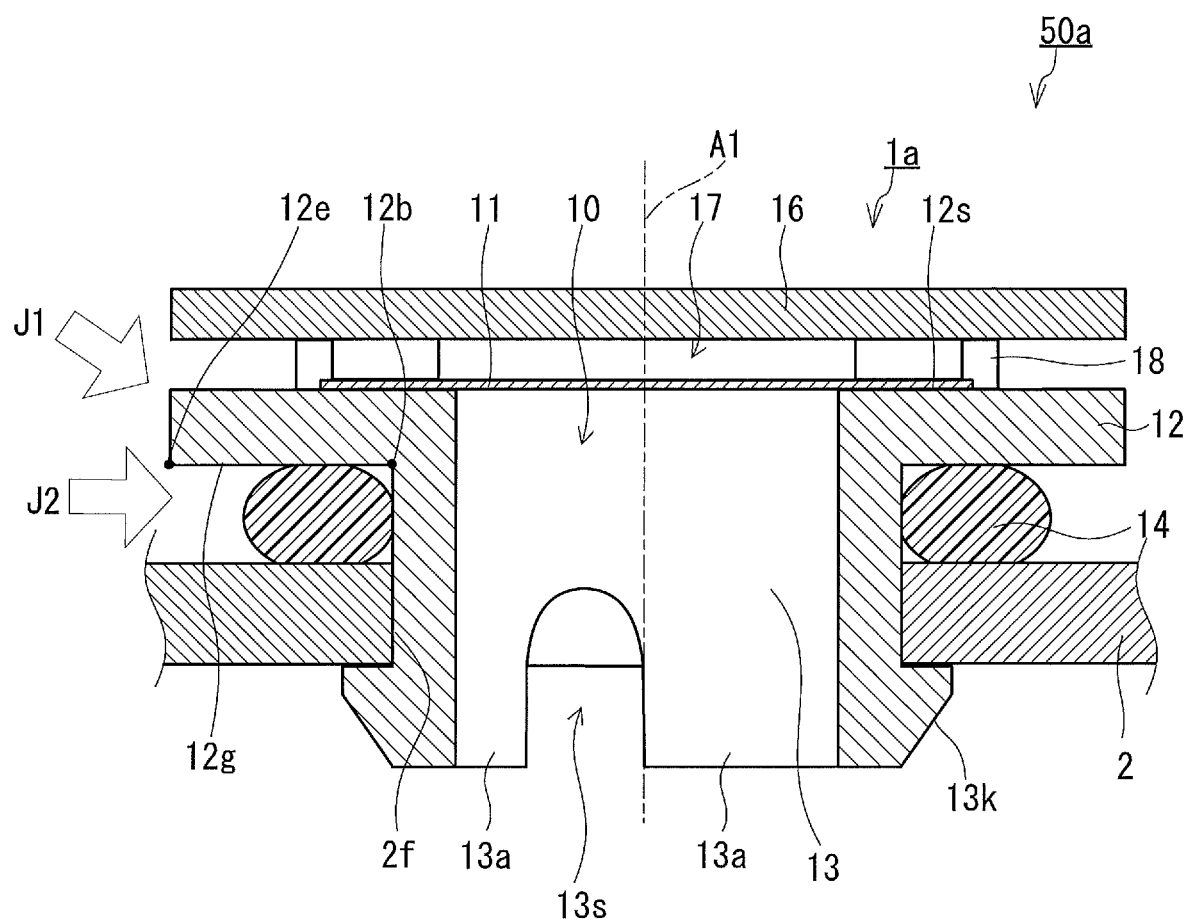
FIG. 2B is a cross-sectional view showing an example of a ventilation structure provided using a ventilation component according to any one of Comparative Examples.

As shown in FIG. 2A, a ventilation structure 50 can be provided by attaching the ventilation component 1 to the edge 2$f$ of the opening 21 of the housing 2. FIG. 2B shows a ventilation structure 50$a$ provided using a ventilation component 1$a$ according to any one of Comparative Examples. The ventilation component 1$a$ is configured in the same manner as the ventilation component 1, unless otherwise described. The components of the ventilation component 1$a$ that are the same as or correspond to those of the ventilation component 1 are denoted by the same reference characters.

For example, Deutsche Industrie Normen DIN 400 50 Part 9 describes a waterproofness test involving jetting of a high-temperature and high-pressure water to a product at angles of 30° and 60°. In the ventilation structure 50$a$, the sealing member 14 is disposed at a position distant from the outside of the ventilation structure 50 to protect the sealing member 14 from a water stream J1 coming from such oblique directions. Therefore, in the ventilation component 1$a$, D/W is adjusted to a value greater than 1.3. This prevents direct exposure of the sealing member 14 to the water stream J1. As described above, from the viewpoint of waterproofness under jetting of high-temperature and high-pressure water, it is conventionally taken for granted that the value of D/W of a ventilation component is defined to be significantly greater than 1.3.

However, according to studies by the present inventors, it is hard to say that a large D/W value is advantageous in facilitating drainage of water from around the sealing member 14 when a high-pressure water stream J2 occurs toward the sealing member 14 of the ventilation component 1$a$. This is because, in that case, a space located around the sealing member 14 and between the supporting portion 12 of the ventilation component 1$a$ and the outer surface 2$g$ of the housing 2 is long, and therefore a high water pressure is continuously applied to the space when the high-pressure water stream J2 occurs toward the sealing member 14. Continuous application of a high water pressure to the sealing member 14 may cause an unintended deformation of the sealing member 14 and may allow water to enter the housing 2.

Application of any of the techniques described in Patent Literatures 1 to 3 is conceivable to prevent exposure of a sealing member to a high water pressure. However, the techniques described in Patent Literatures 1 to 3 require a washer, an opening having a tapered surface, and a shield, which impose restrictions upon design and manufacturing of a ventilation structure. For example, it is hard to say that the techniques described in Patent Literatures 1 to 3 are advantageous from the viewpoint of high design flexibility and low manufacturing cost. Therefore, the present inventors made intensive studies to newly develop a ventilation component capable of reducing restrictions upon design and manufacturing of a ventilation structure and capable of preventing water from entering a housing upon exposure to a high-pressure water stream. That eventually led the present inventors to newly find that adjustment of the D/W value of a ventilation component within the above range can reduce restrictions upon design and manufacturing of a ventilation structure and can prevent water from entering the housing upon exposure to a high-pressure water stream.

The ventilation component 1 satisfies the requirement $0.7 \leq D/W \leq 1.3$. Therefore, in the ventilation structure 50, when a high-pressure water stream occurs toward the sealing member 14, water can easily escape from around the sealing member 14 and drainage of water from around the sealing member 14 is facilitated, as shown in FIG. 2A. This makes it possible to avoid continuous application of a high water pressure to the sealing member 14 and thus can prevent water from entering the housing 2.

Around an axis A1 of the ventilation component 1, the value of D may be constant or may vary. In the case where the value of D varies around the axis A1, for example, the requirement $0.7 \leq D/W \leq 1.3$ is satisfied in an angle range of 50% or more of 360° around the axis A1. The angle range may be continuous around the axis A1 or may be divided into a plurality of angle ranges around the axis A1. Desirably, the requirement $0.7 \leq D/W \leq 1.3$ is satisfied in an angle range of 60% or more of 360° around the axis A1. More desirably, the requirement $0.7 \leq D/W \leq 1.3$ is satisfied in an angle range of 70% or more of 360° around the axis A1. Even more desirably, the requirement $0.7 \leq D/W \leq 1.3$ is satisfied in an angle range of 80% or more of 360° around the axis A1. Particularly desirably, the requirement $0.7 \leq D/$ W≤1.3 is satisfied in an angle range of 90% or more of 360° around the axis A1. Most desirably, the requirement $0.7 \leq D/W \leq 1.3$ is satisfied in 360° around the axis A1.

The cross-sectional diameter W typically corresponds to a maximum dimension of a cross-section of the sealing member 14 along a plane including the axis A1, the maximum dimension being defined in a direction perpendicularly to the axis A1. The cross-sectional diameter W is typically constant around the axis A1. The cross-sectional diameter W may be considered constant around the axis A1 when a difference between the maximum and the minimum of the cross-sectional diameter W around the axis A1 is less than 10% of the minimum.

Figure 5:
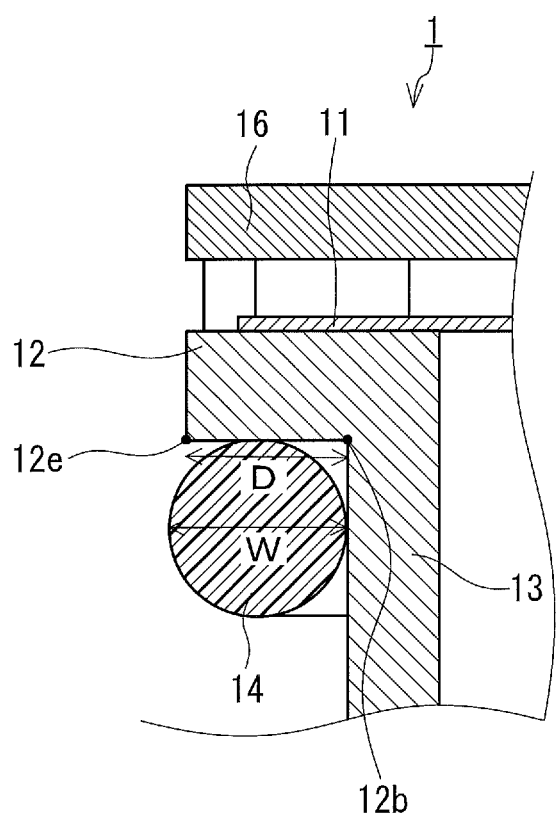
FIG. 5 is a cross-sectional view showing another example of the ventilation component according to the present invention.

The value of D/W is not limited to a particular value as long as the requirement $0.7 \leq D/W \leq 1.3$ is satisfied. The value of D may be equal to or more than the value of W as shown in FIG. 4 or may be less than the value of W as shown in FIG. 5. The value of D/W may be 0.75 or more, 0.8 or more, or 0.85 or more. The value of D/W may be 1.25 or less, 1.2 or less, or 1.15 or less.

The cross-sectional diameter W is not limited to a particular value as long as the requirement $0.7 \leq D/W \leq 1.3$ is satisfied. The cross-sectional diameter W is, for example, 2.8 mm or more and 6.0 mm or less. In this case, in the ventilation structure 50, the contact area between the sealing member 14 and the supporting portion 12 and the contact area between the sealing member 14 and the outer surface 2g of the housing 2 are likely to be large. Consequently, in the ventilation structure 50, water can more reliably be prevented from entering the housing 2 when a high-pressure water stream occurs toward the sealing member 14.

The cross-sectional diameter W may be 2.9 mm or more, 3.0 mm or more, 3.2 mm or more, 3.4 mm or more, 3.6 mm or more, 4.0 mm or more, or 4.5 mm or more. The cross-sectional diameter W may be 5.9 mm or less, 5.6 mm or less, 5.3 mm or less, or 4.8 mm or less.

The distance D is not limited to a particular value as long as the requirement $0.7 \leq D/W \leq 1.3$ is satisfied. The distance D is, for example, 1.96 mm or more and 7.8 mm or less.

The distance D may be 2.2 mm or more, 2.4 mm or more, 2.6 mm or more, 2.8 mm or more, 3.0 mm or more, or 3.2 mm or more, or 3.5 mm or more. The distance D may be 7.5 mm or less, 7.0 mm or less, 6.5 mm or less, or 6.0 mm or less.

The shape of the sealing member 14 is not limited to a particular shape. The sealing member 14 is typically a ring-shaped member. A cross-section of the sealing member 14 taken along a plane including an axis of the sealing member 14 is, for example, a circular plane, an elliptical plane, or a plane having a corner. The plane having a corner may be a polygon or a figure composed of a combination of a curved line and a straight line. The sealing member 14 may have a hollow structure having a ring-shaped inner space.

As shown in FIG. 4, the sealing member 14 includes, for example, a slope portion 14k. The slope portion 14k forms a slope between a first position 14f and a second position 14s each positioned in an outer peripheral portion of the sealing member 14. The second position 14s is closer to the supporting portion 12 than the first position 14f is, and is closer to the boundary 12b than the first position 14f is. According to this configuration, in the ventilation structure 50, when a high-pressure water stream occurs toward the sealing member 14, the water stream is likely to be led away from the outer surface 2g of the housing 2 after hitting the slope portion 14k. This facilitates drainage of water from around the sealing member 14. The first position 14f is, for example, at an outer end of the sealing member 14, the outer end being defined in the direction perpendicular to the axis of the sealing member 14.

As shown in FIG. 1, the protruding portion 13 includes, for example, a plurality of leg portions 13a. The plurality of leg portions 13a are disposed around a central axis of the protruding portion 13 and spaced from each other by a slit 13s extending from the end of the protruding portion 13 along the central axis of the protruding portion 13. At least one of the plurality of leg portions 13a includes an engaging portion 13k capable of being engaged with the housing 2. The engaging portion 13k protrudes outward in a direction perpendicular to the central axis of the protruding portion 13. According to this configuration, in a procedure, including insertion of the protruding portion 13 into the opening 21, for attaching the ventilation component 1 to the housing 2, the leg portion 13a elastically deforms inward when an end portion of the protruding portion 13 comes into contact with the edge 2f. Then, the deformed leg portion 13a returns to its original form when the engaging portion 13k passes through the opening 21, and the engaging portion 13k, for example, comes into contact with an inner surface 2n of the housing 2. In this manner, the engaging portion 13k is engaged with the housing 2 by snap-fitting and the ventilation component 1 is attached to the edge 2f of the housing 2.

The supporting portion 12 and the protruding portion 13 may be an integrally-molded component or may be components separately produced. The materials of the supporting portion 12 and the protruding portion 13 are, for example, a thermoplastic resin in view of moldability. Examples of the thermoplastic resin can include polyamides (PA), polyethylene terephthalate (PET), polyphenylene sulfide (PPS), polybutylene terephthalate (PBT), polycarbonate (PC), polypropylene (PP), polyphenylene ether (PPE), and thermoplastic elastomers. The materials of the supporting portion 12 and the protruding portion 13 may be a thermosetting resin or a metal. The materials of the supporting portion 12 and the protruding portion 13 may be a rubber. Examples of the rubber include nitrile-butadiene rubber (NBR), ethylene propylene rubber (EPDM), silicone rubbers, fluorine rubbers, acrylic rubbers, and hydrogenated nitrile rubbers.

As shown in FIG. 1, the supporting portion 12 typically includes an adherend surface 12s to which the gas-permeable membrane 11 is attached. The adherend surface 12s is, for example, a ring-shaped surface. The gas-permeable membrane 11 is disposed, for example, along the direction perpendicular to the central axis of the protruding portion 13.

The gas-permeable membrane 11 is not limited to a particular gas-permeable membrane as long as the gas-permeable membrane 11 has desirable gas permeability. The gas-permeable membrane 11 may be a single layer membrane, or may be a multilayer membrane. In the case where the gas-permeable membrane 11 is a multilayer membrane, each layer thereof can be one selected from the group consisting of a porous membrane, a nonwoven fabric, a cloth, and a mesh. The gas-permeable membrane 11 may include: a porous membrane and a nonwoven fabric; a porous membrane and at least one of a cloth and a mesh; or a plurality of nonwoven fabrics. Typically, the gas-permeable membrane 11 is composed of an organic polymer material (resin). The material of the porous membrane is, for example, a fluorine resin. As the fluorine resin can be used, for example, polytetrafluoroethylene (PTFE), polychlorotrifluoroethylene, a tetrafluoroethylene-hexafluoropropylene copolymer, or a tetrafluoroethylene-ethylene copolymer.

The material of the porous membrane may be a polyolefin, such as a homopolymer or copolymer of a monomer(s) such as ethylene, propylene, or 4-methylpentene-1,1-butene. The porous membrane may be a porous nanofiber membrane made of, for example, polyacrylonitrile, nylon, or polylactic acid. The porous membrane can be manufactured by a known drawing or extraction technique. Examples of the materials of the nonwoven fabric, the cloth, and the mesh include polyesters such as polyethylene terephthalate, polyolefins such as polyethylene and polypropylene, nylon, aramids, and ethylene-vinyl acetate copolymer.

The gas-permeable membrane 11 desirably includes a PTFE porous membrane. The PTFE porous membrane can ensure gas permeability with a small area and can effectively prevent entry of foreign matters. The PTFE porous membrane may be layered on a gas-permeable supporting member such as a nonwoven fabric.

The gas-permeable membrane 11 may be subject to a liquid-repellant treatment as necessary. The liquid-repellant treatment is performed, for example, by forming a liquid-repellant coating film containing a fluorine surface modifier having a perfluoroalkyl group on the gas-permeable membrane 11. The method for forming the liquid-repellant coating film is not limited to a particular formation method. The liquid-repellant coating film is formed, for example, by coating a porous resin membrane with a solution or dispersion of a fluorine surface modifier having a perfluoroalkyl group by a method such as air spraying, electrostatic spraying, dip coating, spin coating, roll coating, curtain flow coating, or impregnation. The liquid-repellant coating film may be formed by electrodeposition or plasma polymerization.

The gas-permeable membrane 11 is, for example, adhered to the adherend surface 12s. The gas-permeable membrane 11 may be welded to the adherend surface 12s. The available welding method can be thermal welding, ultrasonic welding, and laser welding. Alternately, at the time of molding the supporting portion 12, the gas-permeable membrane 11 may be attached to the adherend surface 12s by insert molding, specifically, by pouring a resin in a mold for molding the supporting portion 12 with the gas-permeable membrane 11 disposed at a given position in the mold. The gas-permeable membrane 11 may be attached to the adherend surface 12s with a double-sided adhesive tape.

The material of the sealing member 14 is not limited to a particular material as long as the sealing member 14 can exhibit desirable sealability. For example, any of the materials described above as examples of the materials of the supporting portion 12 and the protruding portion 13 can be used as the material of the sealing member 14. The sealing member 14 is typically an elastic body that is elastically deformable, and the material of the sealing member 14 can be an elastomer such as a natural rubber, a synthetic rubber, or a thermoplastic elastomer.

As shown in FIG. 1, the ventilation component 1 further includes, for example, a cover 16. The cover 16 is coupled to the supporting portion 12. The cover 16 covers the gas-permeable membrane 11 and forms, between the gas-permeable membrane 11 and the cover 16, a space 17 communicating with an outer space of the ventilation component 1. The space 17 serves as a part of the ventilation path 10. Owing to the cover 16, the gas-permeable membrane 11 is protected appropriately.

The cover 16 may be a component integrally molded with the supporting portion 12 or may be a component produced separately from the supporting portion 12. Any of the materials described as examples of the material of the supporting portion 12, for example, can be used as the material of the cover 16.

At least one of the supporting portion 12 and the cover 16 may have a side wall 18 disposed at an outer perimeter of the space 17. The side wall 18 can include a plurality of side walls separately disposed in a perimeter direction of the space 17 at given intervals. The supporting portion 12 and the cover 16 each may have a plurality of side walls separately disposed in the perimeter direction at given intervals. In that case, the side walls of the supporting portion 12 and the side walls of the cover 16 may partially overlap in the perimeter direction.

In the ventilation structure 50, the housing 2 is, for example, a housing of an electronic device. Examples of the electronic device include automotive electronic devices, such as vehicle lamps, electronic control units (ECUs), electric power systems (EPSs), battery packs, inverters, converters, millimeter-wave radars, and vehicle-mounted cameras. The electronic device may be one used in applications other than use for automobiles. In the ventilation structure 50, the ventilation path 10 can eliminate a pressure difference occurring between the internal space 2u and the outer space 2s of the housing 2 due to a temperature variation. Moreover, since the gas-permeable membrane 11 closes the ventilation path 10 in a ventilatable manner, entry of foreign matters into the internal space 2u can be prevented and, for example, the ventilation structure 50 has dust proofness. Furthermore, the ventilation structure 50 can prevent entry of water, oil, salt, etc. into the internal space 2u.

Examples

Hereinafter, the present invention will be described in more detail by examples. The present invention is not limited to the examples given below.

Figure 6:
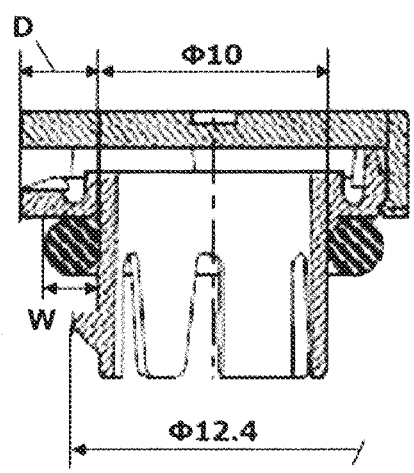
FIG. 6 is a cross-sectional view showing a ventilation component used in Examples and Comparative Examples.

Ventilation components having a distance D of 1.5 mm, 1.8 mm, 2.5 mm, 3.0 mm, 3.5 mm, 4.0 mm, and 5.0 mm were each prepared by processing a portion of a ventilation component TEMISH Z series Z3-NTF210SE shown in FIG. 6 and manufactured by Nitto Denko Corporation into an outer face of a supporting portion, the distance D being from an outer edge of the outer face of the supporting portion to a boundary between a protruding portion and the supporting portion. As shown in FIG. 6, the ventilation components each included the protruding portion having an outer diameter of 10 mm and an engaging portion having an outer diameter of 12.4 mm before the processing. TEMISH is a registered trademark of Nitto Denko Corporation. An O-ring α having a cross-sectional diameter W of 2.40 mm and an O-ring β having a cross-sectional diameter W of 3.85 mm were prepared. The hardness of the O-ring α and that of the O-ring β were measured using a type A durometer. The O-ring α had a hardness of 70, and the O-ring β had a hardness of 50. The O-ring α or the O-ring β was attached to each ventilation component after the processing to prepare samples according to Examples 1 to 4 and Comparative Examples 1 to 4 as shown in Table 2.

<Water Resistance Test>

The protruding portions of the samples according to Examples 1 to 4 and Comparative Examples 1 to 4 were each inserted into and fixed to a housing having a circular opening having a diameter of 10.4 mm. The O-rings α and β had a compression rate (compression rate [%] of O-ring=O-ring compression squeeze (a decrease in length in a compression direction under compression)/cross-sectional diameter W of O-ring×100) of 15% in a state where each sample was fixed to the housing. The samples according to Examples 1 to 4 and Comparative Examples 1 to 4 were subjected to a water resistance test (actual test) according to Deutsche Industrie Normen DIN 400 50 Part 9, except that conditions defined therein were changed to conditions shown in Table 1. Ingress of water was visually checked. Table 2 shows the results.

TABLE 1

|  | DIN 400 50 Part 9 (IPX9K) | Actual test |
|---|---|---|
| Temperature | 80 ± 5° C. | 25° C. |
| Pressure | 8 to 10 MPa | 8 MPa |
| Amount of water | 15 ± 1 L/min | 14 L/min |
| Distance | 100 to 150 mm | 150 mm |
| Rotation speed | 5 rpm | 5 rpm |
| Jetting angle | 0°, 30°, 60°, 90° | 0°, 30°, 60°, 90° |
| Jetting duration | 30 seconds at each angle | 30 seconds at each angle |

TABLE 2

|  | Distance D [mm] | Cross-sectional diameter W [mm] | D/W | Water resistance test |
|---|---|---|---|---|
| Example 1 | 1.8 | 2.40 | 0.750 | No ingress of water |
| Example 2 | 3.0 | 2.40 | 1.250 | No ingress of water |
| Example 3 | 3.5 | 3.85 | 0.909 | No ingress of water |
| Example 4 | 4.0 | 3.85 | 1.039 | No ingress of water |
| Comparative Example 1 | 1.5 | 2.40 | 0.625 | Ingress of water |
| Comparative Example 2 | 3.5 | 2.40 | 1.458 | Ingress of water |
| Comparative Example 3 | 2.5 | 3.85 | 0.649 | Ingress of water |
| Comparative Example 4 | 5.2 | 3.85 | 1.351 | Ingress of water |

The invention claimed is:

1. A ventilation component configured to be attached to an edge of an opening of a housing, the opening communicating with an inner space and an outer space of the housing, the ventilation component comprising:
   a ventilation path for allowing ventilation between the inner space and the outer space when the ventilation component is attached to the edge;
   a supporting portion surrounding the ventilation path;
   a gas-permeable membrane bonded to the supporting portion and closing the ventilation path in a ventilatable manner;
   a protruding portion having a tubular shape, the protruding portion being arranged to protrude from the supporting portion and surround one end of the ventilation path, the protruding portion being configured to be in contact with the edge when the ventilation component is attached to the edge; and
   a sealing member disposed around the protruding portion, the sealing member being configured to seal a gap between an outer surface of the housing and the ventilation component when the ventilation component is attached to the edge, wherein
   the ventilation component satisfies a requirement $0.7 \leq D/W \leq 1.3$, where D is a distance from an outer edge of an outer face of the supporting portion to a boundary between the protruding portion and the supporting portion, the outer face being in contact with the protruding portion, the outer edge being defined when the outer face is viewed in plan, and W is a cross-sectional diameter of the sealing member.

2. The ventilation component according to claim 1, wherein the cross-sectional diameter W is 2.8 mm or more and 6.0 mm or less.

3. The ventilation component according to claim 1, wherein the distance D is 1.96 mm or more and 7.8 mm or less.

4. The ventilation component according to claim 1, wherein the protruding portion has an engaging portion capable of being engaged with the housing.

5. The ventilation component according to claim 1, further comprising a cover covering the gas-permeable membrane, the cover forming, between the gas-permeable membrane and the cover, a space communicating with an outer space of the ventilation component.

6. The ventilation component according to claim 1, wherein the protruding portion comprises a plurality of leg portions, at least one of said leg portions being configured to engage with an inner edge of the housing.

* * * * *